US006781911B2

(12) United States Patent
Riesenman et al.

(10) Patent No.: US 6,781,911 B2
(45) Date of Patent: Aug. 24, 2004

(54) EARLY POWER-DOWN DIGITAL MEMORY DEVICE AND METHOD

(75) Inventors: Robert J. Riesenman, Sacramento, CA (US); James M. Dodd, Shingle Springs, CA (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 10/119,919

(22) Filed: Apr. 9, 2002

(65) Prior Publication Data

US 2003/0189868 A1 Oct. 9, 2003

(51) Int. Cl.[7] .............................................. G11C 7/00
(52) U.S. Cl. ...................... 365/226; 365/229; 713/322; 713/323
(58) Field of Search .............................. 365/226, 227, 365/229, 189.01, 191, 194; 713/322, 323, 324

(56) References Cited

U.S. PATENT DOCUMENTS

| | | | | |
|---|---|---|---|---|
| 6,021,082 A | * | 2/2000 | Shirai | 365/226 |
| 6,115,823 A | * | 9/2000 | Velasco et al. | 713/322 |
| 6,141,283 A | * | 10/2000 | Bogin et al. | 365/226 |
| 6,618,791 B1 | * | 9/2003 | Dodd et al. | 711/105 |
| 2002/0036922 A1 | * | 3/2002 | Roohparvar | 365/185.11 |
| 2002/0078316 A1 | * | 6/2002 | Nakamura | 711/167 |

OTHER PUBLICATIONS

Micron Technology, Inc., *TN–48–07 Migrating from FPM/EDO to SDRAM*, Rev. 5/00, pp.1–3.

Micron Technology, Inc., *TN–48–05 SDRAM Write to Active Command Timing*, Rev. 11/00, pp. 1–3.

Micron Technology, Inc., *TN–46–05 General DDR SDRAM Functionality*, Rev. A Pub. 7/01, pp. 1–11.

Micron Technology, Inc., *TN–48–01 Examples of Read-Modify–Write Cycles with Synchronous DRAMs*, Rev. 2/99, pp. 1–3.

Micron Technology, Inc., *64Mb: x32 Synchronous DRAM*, Rev. 9/00, pp. 1–53.

Micron Technology, Inc., *512Mb: x4, x8, x16 Double Data Rate(DDR) SDRAM*, Rev. B; Pub. 4/01, pp. 1–68.

* cited by examiner

*Primary Examiner*—Anh Phung
*Assistant Examiner*—Toan Le
(74) *Attorney, Agent, or Firm*—Marger Johnson & McCollom P.C.

(57) ABSTRACT

Methods and devices for a memory system are disclosed. A digital memory device can receive power-down commands during the pendency of an active-mode command such as a burst read or write, that is, "early". The device shuts down some circuitry, such as address and command registers, immediately upon receipt of the early power-down command. Other device components, e.g., those involved in servicing the burst read or write, remain active at least until their portion of the command has been completed. In some embodiments, the early power-down command can be issued concurrently with an active-mode command as an option to that command, freeing a memory controller from having to schedule and issue power-down commands separately. Significant power savings, as compared to those obtained with prior-art memory device power-down modes, are possible.

22 Claims, 10 Drawing Sheets

EARLY POWER-DOWN DIGITAL MEMORY DEVICE AND METHOD

FIELD OF THE INVENTION

This present invention relates generally to digital memory devices and systems, and more particularly to power-saving modes for such devices and systems.

BACKGROUND OF THE INVENTION

Figure 1:
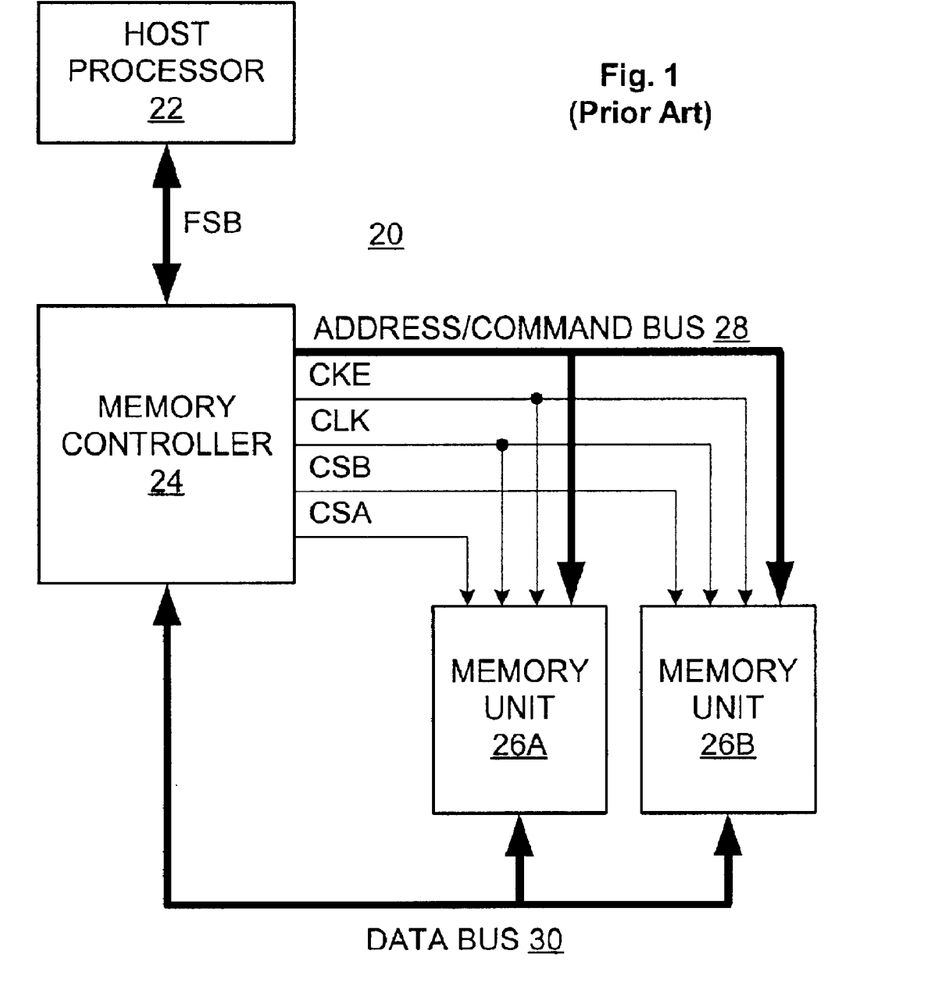
FIG. 1 illustrates a typical memory system configuration.

Microprocessors, digital signal processors, digital imaging devices, and many other types of digital data processing devices rely on an attached high-speed memory system to hold data and/or processor instructions needed by the processing device. FIG. 1 depicts a typical memory system configuration 20. A host processor 22 issues data store and retrieve requests to a memory controller 24 over a front-side bus FSB. Memory controller 24 acts as an intermediary for the exchange of data between processor 22 and memory devices 26A and 26B. The memory controller performs memory transfers by relating the processor's memory requests (into its view of a contiguous memory space) to the individual memory devices' activation, addressing, timing, and bus signaling requirements. The memory controller's techniques for partitioning and accessing the memory devices may be highly optimized in order to avoid wasted bus cycles; the controller may also perform memory management functions such as device initialization, refresh for memories that require refresh, etc.

Various circumstances can exist to cause any particular memory device's duty cycle (i.e., the percent of the time that the device is actually performing memory operations) to be relatively low, either for brief periods (e.g., a microsecond) or for extended periods. For instance, the processor may be sleeping, lightly loaded, or successfully hitting an intermediate cache (and therefore not needing to access the main memory).

Normally, memory devices are maintained in a ready state that allows them to respond to a new request from a memory controller within a few clock cycles. In order to reduce power consumption, e.g., for battery-powered or energy-conserving devices, many existing memory devices offer a "power-down" mode that deactivates input and output buffers and other clocked circuitry, without loss of data. During a time when a memory device is idle, the memory controller can instruct that device to enter the power-down mode, thereby saving a significant fraction of the device's ready-state power.

BRIEF DESCRIPTION OF THE DRAWINGS

The invention may be best understood by reading the disclosure with reference to the drawing, wherein.

DETAILED DESCRIPTION OF THE EMBODIMENTS

Although existing power-down modes are useful, what apparently has been heretofore unrecognized is that further increases in power savings are possible, with little added memory device complexity. Embodiments described herein allow a memory controller to issue a power-down command to a memory device much earlier, e.g., while a read or write command is still in process. For instance, a controller may request an eight-clock-cycle burst read from a device. A prior art controller has to wait until the memory device sets up the read, transfers the data to the controller over eight bus cycles, and possibly executes a precharge command to release the active word line—all before the controller can issue a power-down command. But in many of the embodiments described below, no waiting is required. Instead, the controller can issue the power-down command immediately after (or concurrently with) the last read, write, or other active-mode command. The memory device then shuts off some unneeded components, such as address/command registers, immediately. As other components finish their tasks, they can be shut down as well. The net result can be additional power savings, and possibly reduced complexity in the controller, which no longer has to worry about when it should issue a power-down command in a wide variety of circumstances. In some embodiments, it becomes feasible to power-down for even very short time intervals, as power savings occur during an active command, and power-up can be accomplished quickly.

Several terms have been assigned particular meanings within the context of this disclosure. A memory device is a solid-state electrical component containing addressable memory space that can be used to store and later retrieve digital data. In this respect, a memory device can be an integrated circuit, a packaged circuit, a rank of such circuits, a memory module containing one or more ranks, etc. The term multi-component memory device recognizes that such devices can usually be divided functionally into circuitry to accomplish various memory device tasks, e.g., control, external bus communication, refresh, row selection, column selection, data storage, etc. The types, speeds, sizes, or numbers of memory devices selected for use with the present invention are not critical, although these parameters may impact how an early power-down strategy is employed. Some possible device types for which the present invention is useful include synchronous dynamic random access memory (SDRAM) devices (including double-data-rate (DDR) SDRAM devices and quad-data-rate (QDR) SDRAM devices), static RAM, and flash memory devices.

An active-mode command is a command that normally leaves a memory device at full readiness (although in some embodiments of the invention, an active-mode command can include a power-down-upon-completion option). Some examples of active mode commands are a command to load a register, activate a word line, read from memory, write to memory, precharge bit lines, terminate a memory burst, auto-refresh, etc. A power-down command is an instruction to a memory device to revert to a state of incomplete readiness that consumes less power than the device consumes at full readiness. Some examples of power-down commands include a standby mode command, sleep mode command, self-refresh command, etc. An early power-down command is issued while an active-mode command is pending or executing, i.e., at a time when an immediate power-down would leave an active-mode command unfinished.

Figure 2:
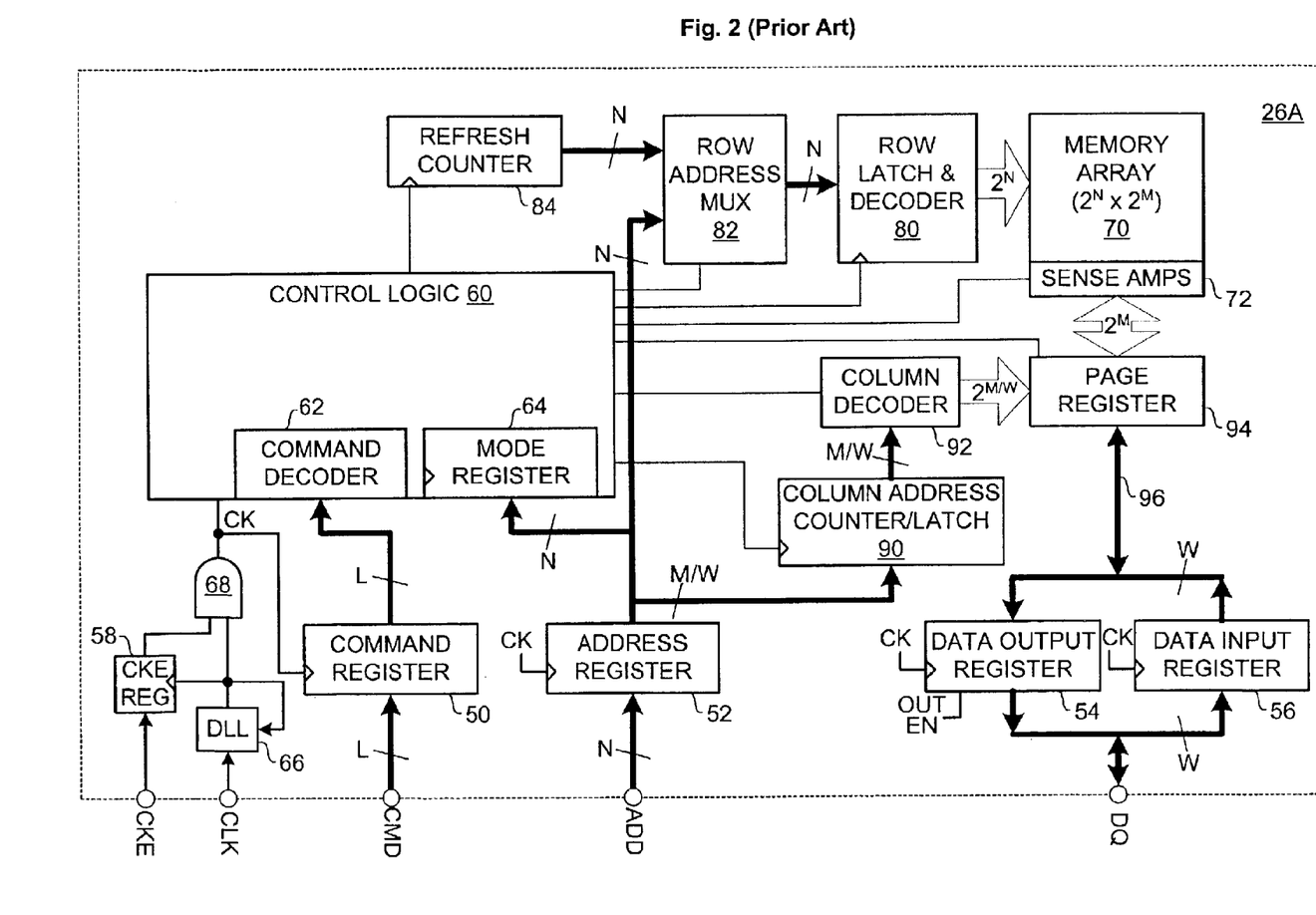
FIG. 2 shows a block diagram for a prior art SDRAM with power-down capability.
Figure 3:
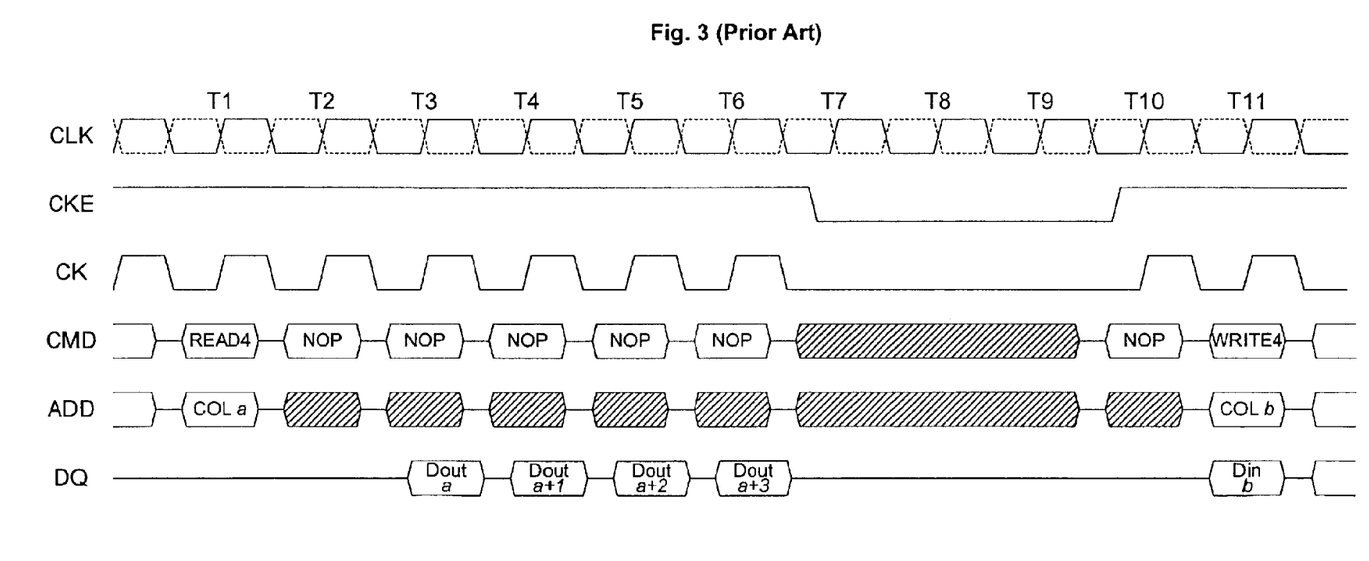
FIG. 3 contains a timing diagram for a read, power-down, and power-up sequence for the SDRAM of FIG. 2.

As an introduction to the embodiments, and to provide a point of contrast with the present invention, a prior-art SDRAM device 26A with prior-art power-down capability is presented in FIGS. 2 and 3.

FIG. 2 contains a block diagram for a prior-art SDRAM device. Device 26A maintains several external connections to a controlling device. Command register 50 receives L-bit-wide commands over a command bus CMD. Address register 52 receives N-bit-wide row addresses, M/W-bit-wide column addresses, or N-bit-wide mode register data, depending on the contents of command register 50, over an address bus ADD. Two registers connect to W-bit-wide data bus DQ. Data output register 54 is capable of driving read data onto bus DQ when output enable OUT EN is asserted; otherwise, register 54 remains in a high-impedance state. Data input register 56 is capable of receiving write data from bus DQ. Delay-locked-loop (DLL) circuit 66 receives an external clock signal CLK and generates a stable internal clock CK based on CLK. Clock enable (CKE) register 58 receives an external clock enable signal CKE. The output of register 58 is combined with the output of DLL 66 to provide the gated internal clock signal CK (the operation of CKE and CK will be described further in connection with FIG. 3). Note that additional external connections (e.g., power, ground, bank select, data strobes, data masks) have not been illustrated, although such connections exist in many/all devices.

Control logic 60 coordinates the overall operation of the memory device. Command decoder 62 interprets the contents of command register 50 at each clock cycle; if the contents require a memory operation, control logic 60 executes that operation, in conjunction with configuration data stored in mode register 64. Execution of an operation generally involves proper sequencing and timing of operations in other device components controlled by control logic 60.

Memory array 70 contains $2^N \times 2^M$ addressable cells, each cell lying at the intersection of one of $2^N$ rows and one of $2^M$ columns (additional redundant cells may also exist for the purpose of replacing defective cells, not shown). Cells along each row share a common word line; cells along each column share a common bit line. Each cell stores one bit of information as a charge on a capacitor. Cell information can be "read" by charge-sense amplifiers 72 that connect to the bit lines (shown here as one sense amp/bit line, although some embodiments use less sense amps, each multiplexed to multiple bit lines). Block 72 also contains write driver circuitry to write data to an active row of array 70.

Row access circuitry comprises row latch and decoder 80, row address multiplexer 82, and refresh counter 84. When control logic 60 signals latch/decoder 80, latch/decoder 80 reads in an N-bit row address from multiplexer 82 and activates the word line corresponding to that row address. Multiplexer 82 selects the row address from one of two sources: an address latched into address register 52 during an activate word line command; or an address supplied by refresh counter 84, for auto-refresh or self-refresh operation.

Control logic 60, in "self-refresh" mode, or an external controller, via "auto-refresh" commands, executes periodic refresh cycles, using refresh counter addressing, to maintain data integrity. Like all DRAM devices, SDRAM 26A requires regular refresh (read/writeback) of the cells on each word line to prevent data loss due to capacitor discharge. Refresh counter 74 cycles through all word line addresses in a repeating cycle, one address each time control logic 60 strobes the counter.

Data access circuitry comprises column address counter/latch 90, column decoder 92, and page register 94. Page register 94 holds $2^M$ bits of data read from a row of memory array 70, or up to $2^M$ bits of data to be written to a row of memory array 70. Page register 94 connects to the data input and output registers by a W-bit-wide bus 96. Column decoder 92 connects data bus 96 to an appropriate set of W register bits in page register 94 for each memory operation. Column decoder 92 determines the appropriate set of register bits by decoding a column address supplied by column address counter/latch 90. When the memory device receives a read or write command, it also receives a starting column address in address register 52. This address is latched into column address counter/latch 90 by control logic 60; if the read or write is a "burst" operation, i.e., multiple W-bit data bus transactions will occur as part of the read or write, counter/latch 90 increments the starting column address for each subsequent bus transaction.

FIG. 3 illustrates, for the device of FIG. 2, a four-word burst read operation, followed by a power-down, a power-up, and the initiation of a four-word burst write to the same row used for the burst read. New memory instructions and addresses are clocked into registers 50 and 52 on the rising edges of CK, i.e., at T1, T2, ..., T11. Thus at T1, a "READ4" command and address "COL a" are registered to the memory device. At T2–T10, "NOP" (No Operation) commands are received (a NOP could include a command to another memory device, which would be received but ignored by this memory device). At T11, a "WRITE4" command and address "COL b" are registered to the memory device.

The address "COL a" latched into address register 52 at T1 is latched into column address counter/latch 90 after the command decoder 62 determines that this is a READ command. The column decoder then selects the data word at "COL a" of the page register for output, and that data word is subsequently clocked into data output register 54. At about T3, OUT EN is asserted and the word is driven onto DQ as "Dout a". Meanwhile, column address counter/latch 80 has been incremented to address column a+1, and the data word from that column of the page register is selected to bus 96. Prior to T4, OUT EN is deasserted, the new word is clocked into data output register 54, and OUT EN is reasserted at about T4—driving "Dout a+1" onto DQ. This process repeats for the data words at columns a+2 and a+3, with the fourth and last word of the burst driven onto DQ at T6.

Prior to T7, CKE is deasserted. At T7, the deasserted CKE is clocked into CKE register 58. This forces the CK output of AND gate 68 low, such that CK no longer follows CLK (i.e., CK is "suspended"). The suspension of CK freezes the device's synchronous logic in its current state. As that logic is typically CMOS-based, the logic requires very little current while the clock is frozen, thus placing the device in a low-power standby mode. In this mode, changes in CMD, ADD, and DQ are not clocked into their respective input registers and no refresh operations are performed.

Prior to T10, CKE is reasserted to "wake up" the circuit. CK once again goes high at T10, and the device is ready to receive a next command, in this case a "WRITE4" command, once clock cycle later at T11.

From FIGS. 2 and 3, it can be appreciated that CK cannot be suspended prior to the completion of the READ4 command, as it is needed through clock cycle T6 to output data. Were CKE deasserted sooner, data loss would occur, and the data output register may be frozen in a state that drives the data bus continually.

It is recognized herein that during the majority of the read operation of FIG. 3, the only elements of the memory device involved in that operation are the data access circuitry (blocks 90, 92, and 94), the data output register, and the portion of the control logic that controls those blocks. And yet the device continues to operate all of its synchronous logic, and continues to read commands and addresses every clock cycle during the burst read—looking for a next command—and not knowing that the memory controller intends to sleep the device as soon as the current read operation ends. Meanwhile, the memory controller must wait until the read operation completes and then issue a separate command to put the device to sleep.

The present disclosure describes embodiments that can employ different power-down behavior than the prior art. It is recognized herein that the use of a large multipurpose clock tree within a memory device can waste power unnecessarily. Within the control logic of a memory device, multiple clock signals can be formed to selectively power-down components of the device at different times, based on an understanding of when during an active-mode command each component is used. Using such capability, the prior-art constraint that a power-down command must be issued only to an idle memory device can be removed. The result is that a memory device can respond to an early power-down command by shutting down the part of the memory device that is not necessary to complete a pending active-mode command.

Figure 4:
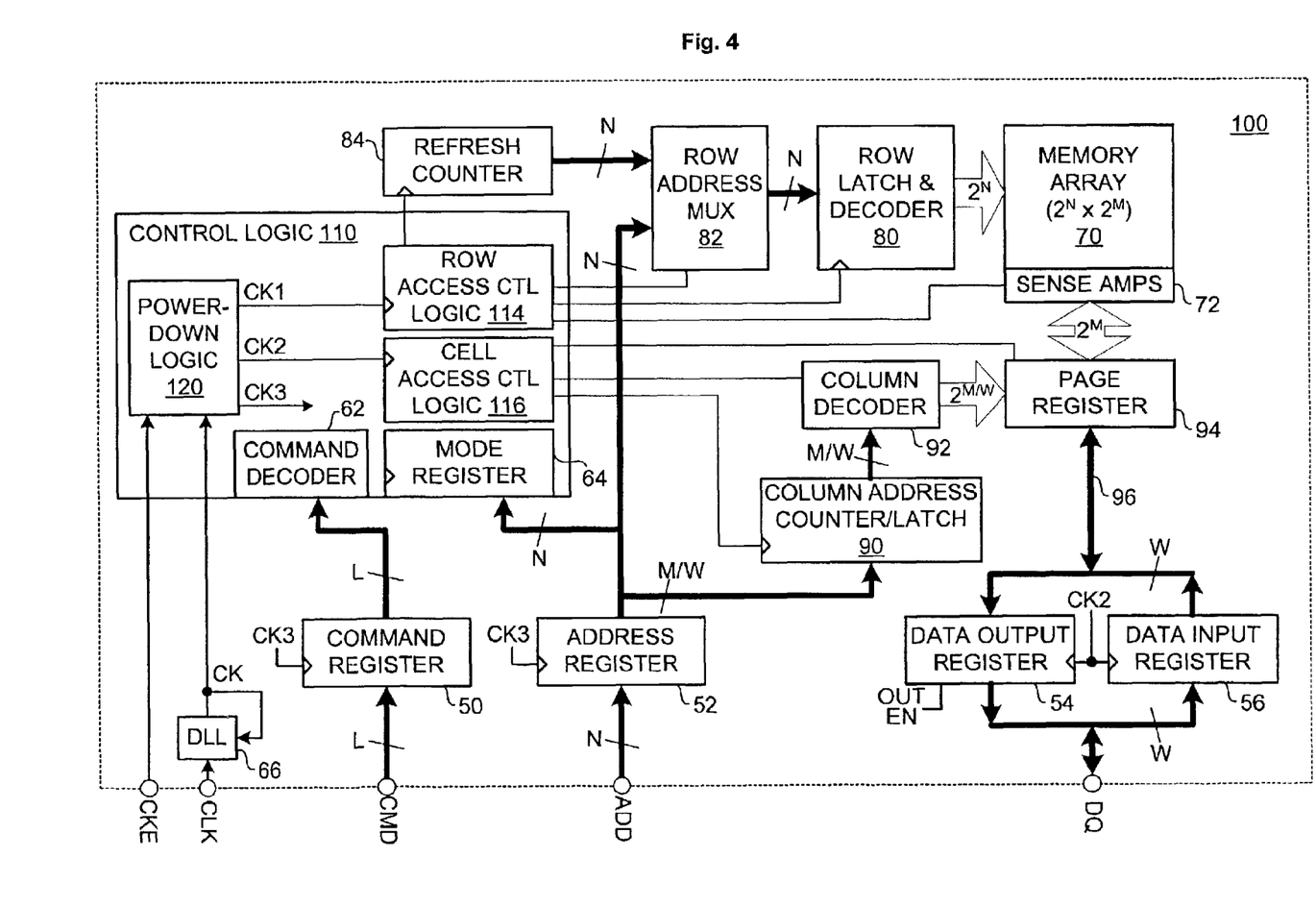
FIG. 4 contains a block diagram for an SDRAM with early power-down capability according to an embodiment of the invention.

FIG. 4 illustrates one embodiment of the invention, SDRAM 100, in block diagram form. Control logic 110 contains a power-down logic block 120 that receives the external clock enable signal CKE and the clock reference CK. Power-down logic 120 generates three separately controllable clock signals CK1, CK2, and CK3, based on CK and the internal state of control logic 110.

Figure 5:
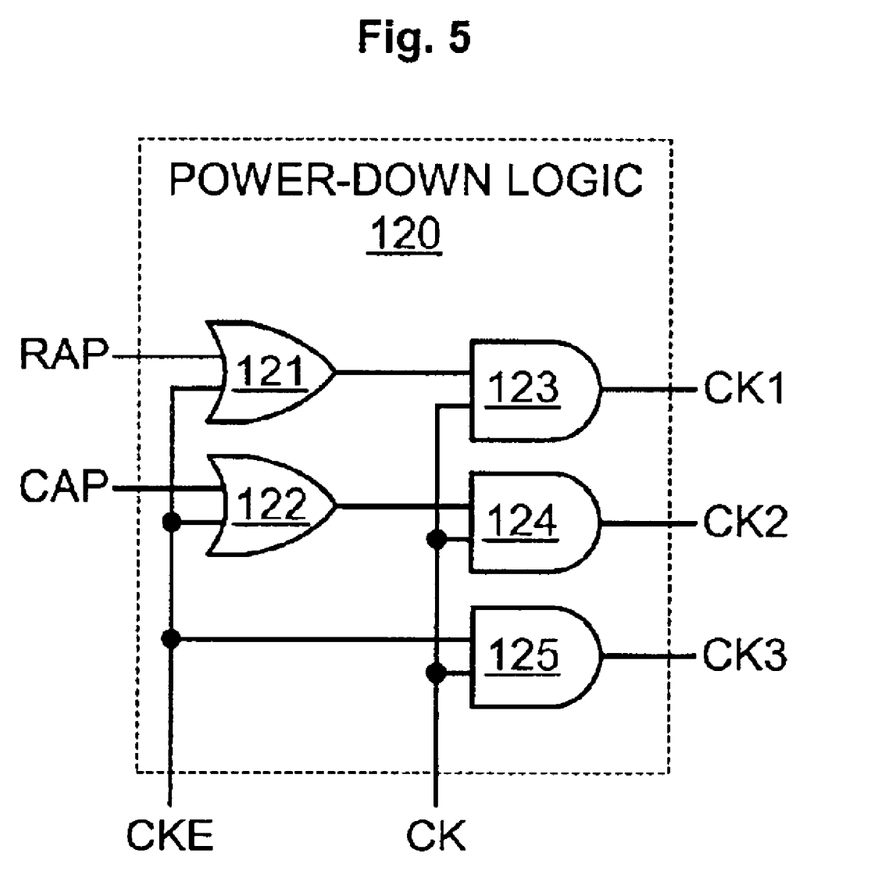
FIG. 5 contains a block diagram for the power-down logic used in the device of FIG. 4.

FIG. 5 shows one possible implementation for power-down logic 120, consisting of two OR gates 121, 122 and three AND gates 123, 124, and 125. OR gate 121 receives inputs CKE and RAP (Row Access Pending), and asserts its output whenever either of these signals is high. RAP is asserted by control logic 110 whenever command decoder 62 receives a row access command, e.g., an activate row command, precharge command, or refresh command. RAP is deasserted when that command completes.

OR gate 122 receives inputs CKE and CAP (Column Access Pending), and asserts its output whenever either of these signals is high. CAP is asserted by control logic 110 whenever command decoder 62 receives a column access command, e.g., a read, write, or burst-terminate command. CAP is deasserted when that command completes.

AND gate 123 forms clock signal CK1 by ANDing the output of OR gate 121 with CK—thus CK1 follows CK whenever CKE and/or RAP is asserted, and is low otherwise. AND gate 124 forms clock signal CK2 by ANDing the output of OR gate 122 with CK—thus CK2 follows CK whenever CKE and/or CAP is asserted, and is low otherwise. AND gate 125 forms clock signal CK3 by ANDing CKE with CK—thus CK3 follows CK whenever CKE is asserted, and is low otherwise.

Clock distribution for the clock signals in device 100 is partitioned according to memory device component function. Clock signal CK serves power-down logic 120. Clock signal CK1 serves row access control logic 114, i.e., the portion of control logic 110 that controls the row access circuitry (blocks 72, 80, 82, and 84). Clock signal CK2 serves cell access control logic 116, i.e., the portion of control logic 110 that controls the cell access circuitry (blocks 90, 92, and 94); clock signal CK2 also serves the two registers that share the DQ bus. Clock signal CK3 serves command register 50 and address register 52.

Figure 6:
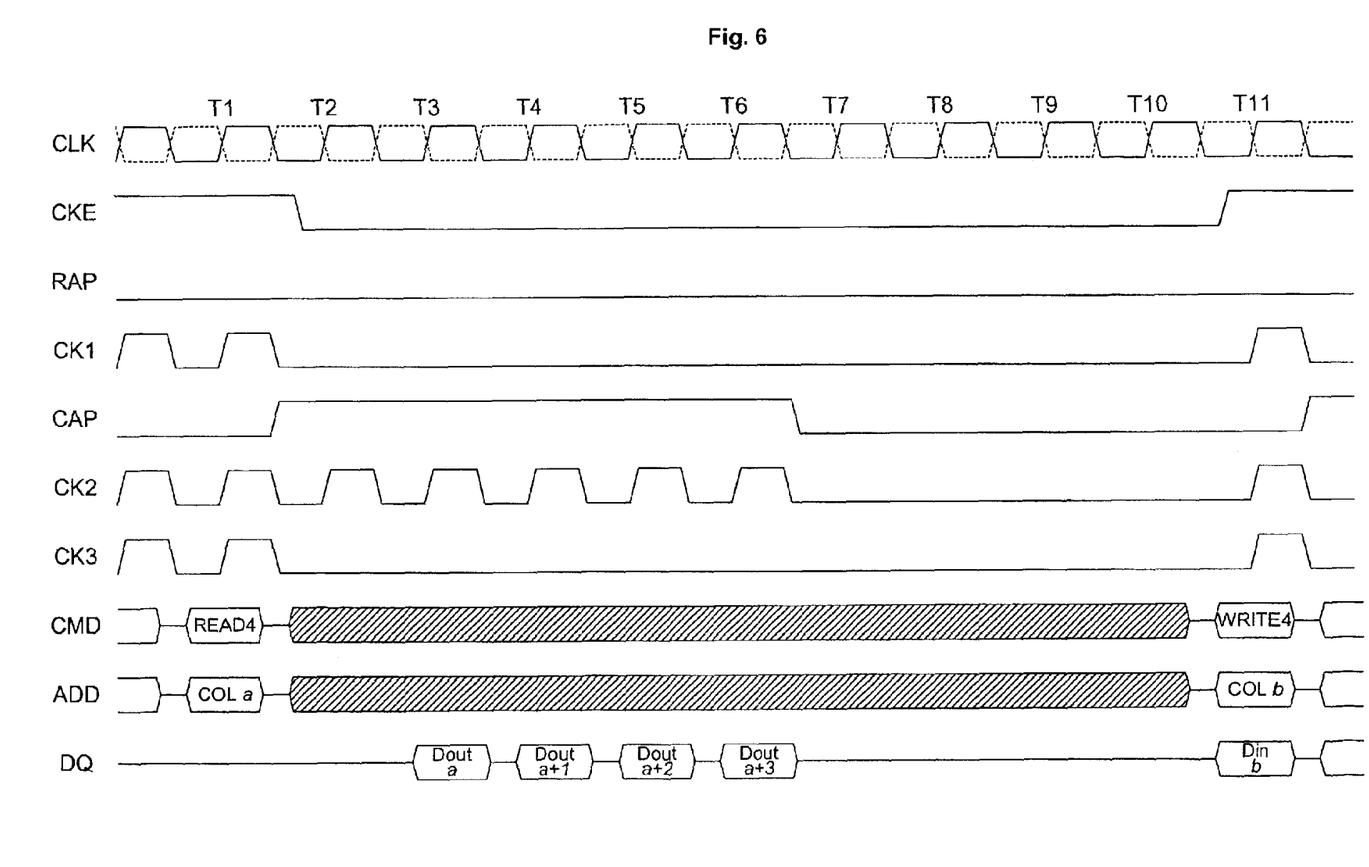
FIG. 6 contains a timing diagram for a read, early power-down, and power-up sequence for the SDRAM of FIG. 4.
Figure 7:
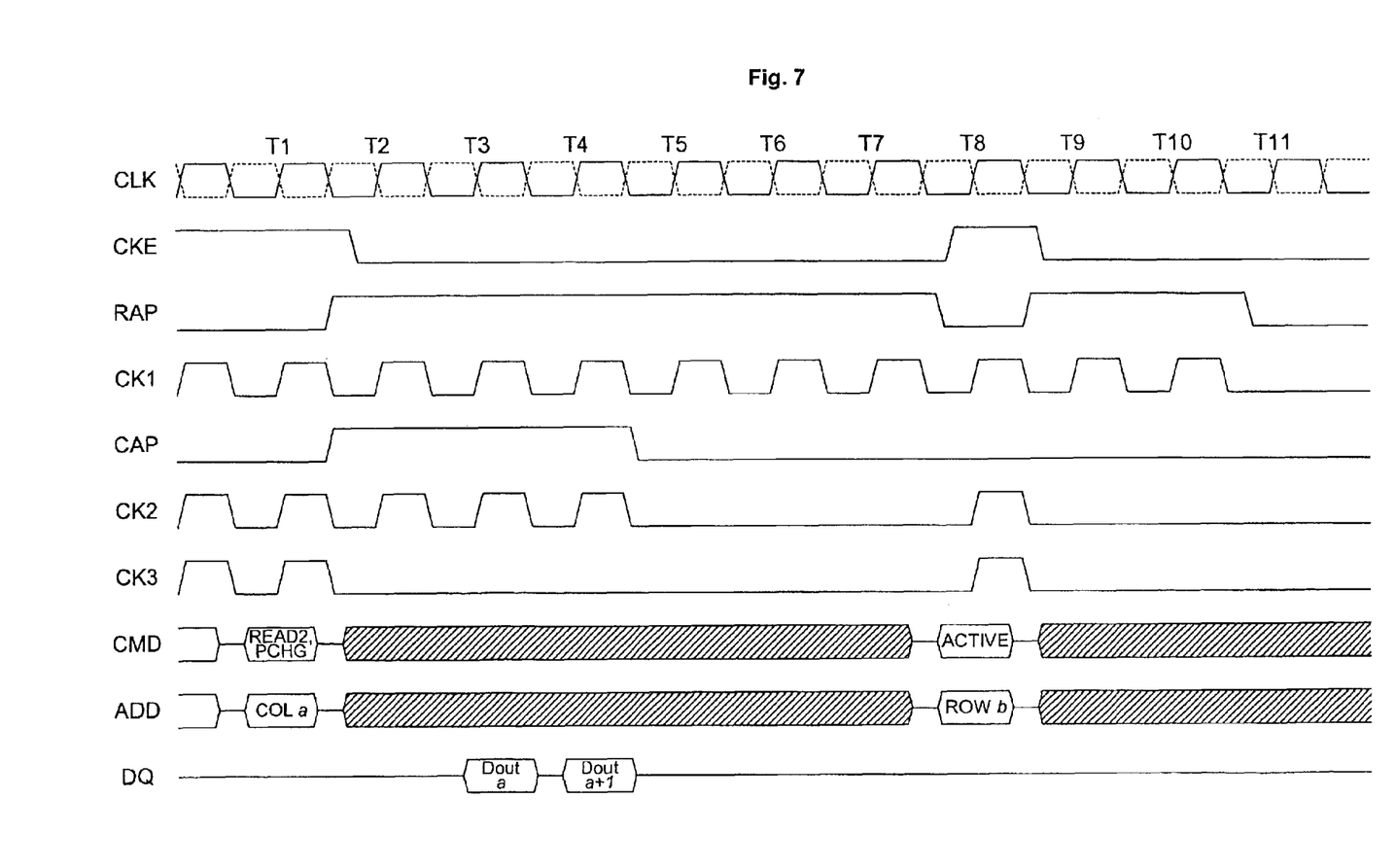
FIG. 7 contains a second timing diagram for a read-with-auto-precharge, early power-down, and power-up sequence for the SDRAM of FIG. 4.

FIGS. 6 and 7 contain illustrative timing diagrams for the embodiment shown in FIGS. 4 and 5. FIG. 6 illustrates the same read and write commands and read/write command timing as shown in FIG. 3. But in FIG. 6, the memory controller takes CKE low prior to T2, signaling the memory device that the controller will consider the device to be on standby after it completes the pending read operation.

At T1, the device decodes the READ4 command and enters a state sequence to perform the requested burst read operation. When the device enters this state sequence, control logic 110 asserts CAP to power-down logic 120. Since the READ4 command does not require row-access states, RAP remains low.

Prior to T2, memory controller takes CKE low, thus blocking CK1 and CK3 from transitioning at T2. As CAP is high prior to the deassertion of CKE, CK2 is unaffected by the CKE transition. Thus those synchronous components of the device that attach to the C2 clock tree continue to operate, while those components of the device that attach to the CK1 and CK3 clock trees freeze at T2.

At T6, cell access control logic 116 asserts OUT EN to data output register 54, which drives Dout a+3 onto DQ. After the preset bus drive time is passed, cell access control logic 116 deasserts OUT EN, and the control logic has completed the last state in the requested burst read. Consequently, CAP goes low, such that at T7, CK2 is prevented from transitioning. At this point, only DLL 66 and power-down logic 120 continue clocked operation, while the remainder of the circuit remains frozen.

Prior to T11, the memory controller transitions CKE high again and places a new command/address on the CMD and ADD buses. CKE high re-enables CK1, CK2, and CK3, such that all components are ready at T11 when the WRITE4 command is received.

Comparing FIG. 6 to FIG. 3, most of device 100 sleeps for nine clock cycles, while none of device 26A sleeps for more than three clock cycles. Also, with device 100 it becomes possible to sleep part of the device even when the controller does not intend to have the device sleep between commands—the sleeping components can merely be "woken up" when the next command is issued.

FIG. 7 shows a two-word burst read followed by an auto-precharge instruction at T1, and activation of a new row b at T8. Here, RAP remains active three clock cycles longer than CAP, keeping CK1 enabled to allow the device to perform the auto-precharge operation. At T8, activation of the new array row b requires the row access logic, but not the column access logic—thus CKE can transition low again prior to T9, stopping CK2 and CK3 immediately while CK1 remains active until the activation command completes.

Figure 8:
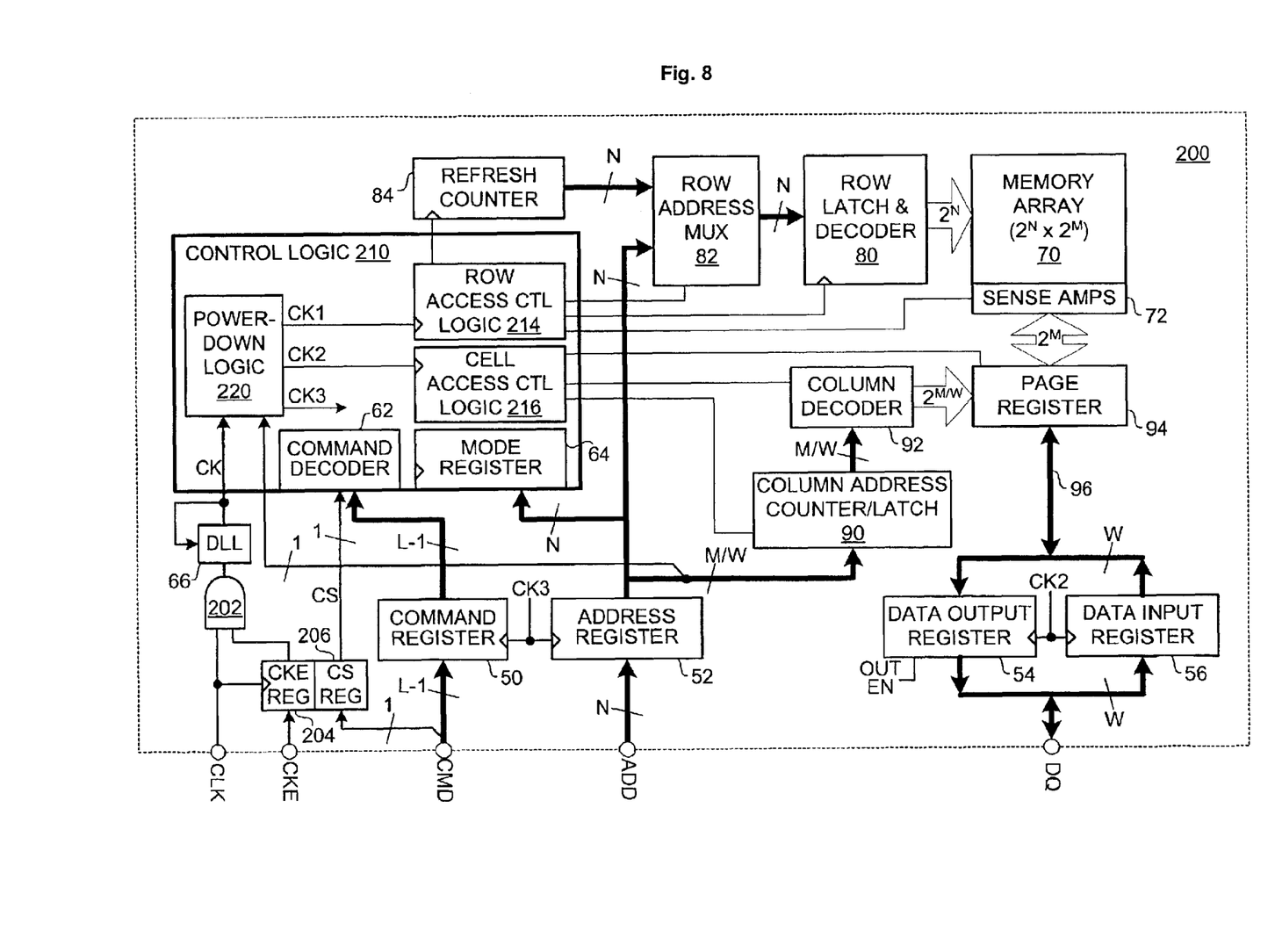
FIG. 8 illustrates a block diagram for an SDRAM with early power-down capability according to a second embodiment of the invention.

An embodiment of the present invention need not use the clock enable signal to signal an early power-down. FIG. 8 illustrates an SDRAM 200 that uses an address register bit as an early power-down option to an active-mode command. This embodiment frees the memory controller from having to issue a separate power-down command following each active-mode command. It also allows CKE to be used for other purposes, and allows multiple memory device ranks to be powered down independently, even though those ranks share a common CKE connection.

On many memory devices, the row address width, N, is greater than the column address width M/W (where M is the number of columns in the cell array and W is the width of the data bus). Since address register 52 must be at least N bits wide, one or more extra address lines may be available when a command is not accompanied by a row address. Device 200 uses one of these address lines, An, as a power-down option bit.

Figure 9:
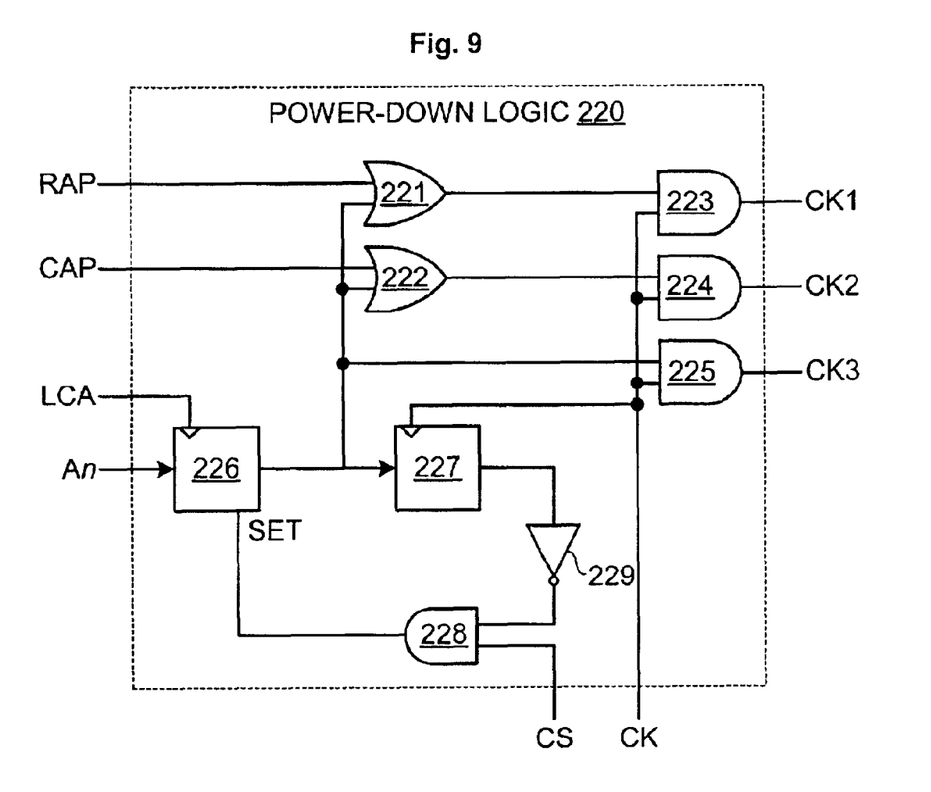
FIG. 9 contains a block diagram for the power-down logic used in the device of FIG. 8.

FIG. 9 shows a block diagram for power-down logic 220 of device 200. Bit An from address register 52 forms the input to register 226. An is registered into 226 only upon a Latch Column Address (LCA) signal, which could be the same signal used to latch a column address into column address counter/latch 90. If An is set high when register 226 receives LCA, Clock Enable (CE)—which has a similar use as CKE in FIG. 5—remains high and all clocks run. If An is unset at this time, however, CE is deasserted, CK3 is disabled, and CK1 and CK2 are controlled by RAP and CAP as previously illustrated. Thus the memory controller can utilize otherwise unused addressing bits to control a device's power-down behavior.

One problem with using a registered bit to power-down is that power-down shuts off the registers, making it impossible to signal a power-up in the same fashion as a power-down. Device 200 avoids this issue by running the Chip Select (CS) bit of the CMD bus through a different register, CS REG 206, which runs off the external clock CLK instead of CK3. Since every command addressed to device 200 must assert CS, the CS bit can be used to "wake up" the device when a valid command is received. FIG. 9 uses register 227, AND gate 228, and inverter 229 to perform a wake-up operation.

Figure 10:
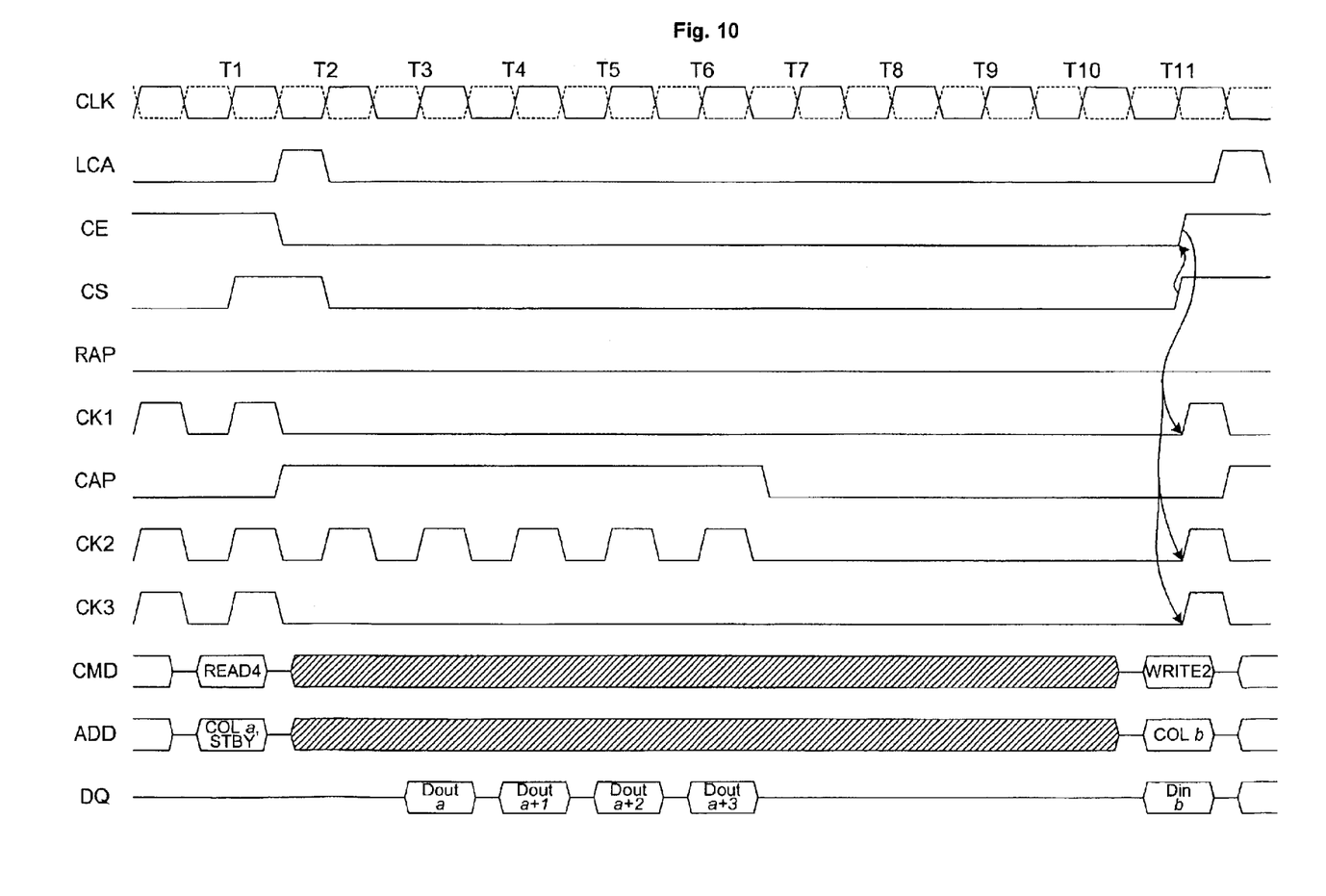
FIG. 10 contains a timing diagram for a read, early power-down, and power-up sequence for the SDRAM of FIG. 8.

Register 227 uses CK as a clock. Every clock cycle, register 227 copies and holds the current value of CE. The output of register 227 passes through inverter 229 to form one input to AND gate 228. Thus whenever CE transitions low (due to an issued power-down command), one input to AND gate 228 will be asserted on the next clock cycle—and every clock cycle thereafter as long as CE remains low. In this condition, the output of AND gate 228 is asserted whenever CS is asserted, i.e., when a new command is received. AND gate 228 is tied to SET on register 226, an input that sets CE high when asserted. This re-enables the clocks CK1, CK2, and CK3, allowing the remainder of the command, address, and possibly data to be clocked in. This behavior is shown in the timing diagram of FIG. 10, where the READ4 command issued at T1 contains a standby option "STBY" attached to the column address, and the WRITE2 command issued at T11 does not.

One other feature of device 200, which may or may not be selected for combination with the features described above, is the capability to have a different power-down function that responds to CKE. In FIG. 8, CKE passes through CKE register 204 to form one input to AND gate 202. The other input to AND gate 202 is CLK, and the AND gate output is the input to DLL 66. Thus CLK is prevented from reaching DLL 66, or any circuitry depending on CK, when CKE is deasserted. This feature could be used with a more comprehensive (but not early) power-down mode that allows CLK to go away for a time period, and then be re-established prior to assertion of CKE, and finally CS.

Many other variations are possible. More than one bit of the address register could be used to signal different power-down options along with a command. For instance, a short-term power down mode could leave more circuitry active than a long-term power-down mode, in order to respond to a wake-up signal in less time.

Another variable is the number of different clock signals controlled by the power-down logic. In a simple embodiment, the number of clock signals could be just two (e.g., one for the command/address registers and one for everything else). In other embodiments, the number of separate clock trees could be more than three. For instance, the data input register and data output register clock signals could be separately controlled, such that the clock to the output register can be turned off during write commands, and the clock to the input register can be turned off during read commands.

The control of more than one input clock signal is also possible. Many faster memory systems use source-synchronous data-bus clocking, i.e., the source of a data word also drives one or more data strobe signals DQS on the bus when a data word is driven. Power-down logic can gate incoming DQS signals such that those signals only affect the data input register when the device has not been issued a power-down command. Further, when a power-down command has been issued while a read command is pending, the power down logic can gate DQS so that the device's outgoing DQS does not affect its own input registers.

Although the power-down logic is illustrated in the figures in a single block, this logic could be distributed within the components themselves, and each component could receive a single power-down flag signal that it would respond to according to its own state. It is preferable, however, to have the logic concentrated near the source of the clock tree so that less clock buffers are driven when in power-down.

One of ordinary skill in the art will recognize that the concepts taught herein can be tailored to a particular application in many other advantageous ways. In particular, those skilled in the art will recognize that the illustrated embodiments are but one of many alternative implementations that will become apparent upon reading this disclosure. Whether a particular signal is asserted when high or low is a design issue, but either can be made to work with the present invention. Various buffers not shown in the drawing may be used to adjust signal timing, reduce loading on a gate or register output, etc. Only a limited set of exemplary memory devices has been presented—many devices could use a banked array architecture, may not need some disclosed components (e.g., refresh circuitry), etc. A memory controller may not be a dedicated unit, but may be encompassed within, e.g., a host processor. Such minor modifications are encompassed within the invention, and are intended to fall within the scope of the claims.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A memory system comprising:
   at least one multi-component memory device comprising power-down logic capable of accepting an early power-down command and responding to that early power-down command by shutting down some memory device components prior to the completion of a pending active-mode command; and
   a memory controller to issue commands to the memory device, the controller capable of issuing the early power-down command to the memory device.

2. The memory system of claim 1, wherein an early power-down command can comprise an option issued by the memory controller concurrently with the issuance of an active-mode command.

3. The memory system of claim 1, wherein the early power-down command has at least two options, each option differing from the other in the number and/or timing of memory device components shut down in response to the power-down command.

4. The memory system of claim 1, wherein the memory device components, including the power-down logic, are integrated on a single integrated circuit.

5. A memory device comprising:
   a memory cell array;
   first circuitry to receive external address and command signals, and to control memory operations in response to received commands;
   second circuitry to interface the memory cell array with an external data bus; and
   power-down logic capable of responding to an early power-down command by shutting down at least part of the first circuitry prior to the completion of a pending active-mode command and shutting down additional circuitry after completion of the pending active-mode command.

6. The memory device of claim 5, wherein the first circuitry comprises clocked address and command registers, and wherein the power-down logic comprises first disable logic to disable clock signals coupled to the address and command registers, in response to a power-down command, while an active-mode command is pending.

7. The memory device of claim 6, wherein the second circuitry comprises clocked memory cell array access logic and clocked external-data-bus registers, and wherein the power-down logic further comprises second disable logic to disable second clock signals coupled to the array access logic and external-data-bus registers, in response to an early power-down command, the second disable logic delaying the second clock signal disable until the completion of a pending active-mode command that uses the external-data-bus registers.

8. The memory device of claim 7, wherein the external-data-bus registers include receive registers operable in response to clock strobe signals received on an external data bus, the power down logic comprising third disable logic to disable clock strobe signal operation early when a pending active-mode command does not use the receive registers.

9. The memory device of claim 7, further comprising a delay-locked-loop circuit capable of synchronizing to an external clock signal, the memory device having at least one first power-down mode that does not power-down the delay-locked-loop circuit.

10. The memory device of claim 9, having at least one second power-down mode that executes a power-down of the delay-locked-loop circuit.

11. The memory device of claim 5, wherein the power-down logic shuts down the at least part of the first circuitry by selectively disabling clock signals to that circuitry.

12. The memory device of claim 5, capable of receiving a power-down command as a power-down option to an active-mode command.

13. The memory device of claim 12, wherein the first circuitry to receive external address and command signals comprises a command register and an address register of a given bit width, and wherein the active-mode commands comprise a write command and a read command, each issued to the command register along with an accompanying column address issued to the address register but not occupying the full address register width, the power-down option comprising the assertion of a signal, during the issuance of a read or write command, on at least one bit of the address register not used for the column address.

14. The memory device of claim 13, wherein the power-down option uses more than one bit of the address register not used for the column address, and wherein the assertion of different bit patterns as the power-down option indicates different power-down modes.

15. The memory device of claim 13, wherein at least one bit of the command register is registered by a clock that is not gated by the power-down logic, that bit, when asserted, causing the power-down logic to power-up any shut-down circuitry on the device.

16. A memory controller comprising:
   an address/command bus driver;
   a data bus transceiver; and
   power-down command logic capable of causing the address/command bus driver to drive an early power-down command to a controlled memory unit, prior to the completion of a data bus transceiver operation with that controlled memory unit.

17. The memory controller of claim 16, wherein the early power-down command comprises a power-down option supplied as part of an active-mode command driven by the address/command bus driver.

18. A method of operating a memory device comprising:
   accepting an externally supplied early power-down command; and
   shutting down part of the memory device not necessary to complete a pending active-mode command while the power-down command is early.

19. The method of claim 18, further comprising shutting down another part of the memory device when the pending active-mode command is complete.

20. The method of claim 18, wherein accepting an early power-down command comprises accepting a power-down-upon-completion option as part of an externally supplied active-mode command.

21. The method of claim 18, wherein accepting an early power-down command comprises interpreting which of several possible power-down modes is requested in the early power-down command, and changing the timing and/or selection of which parts of the memory device to shut down based on the interpreted power-down mode.

22. The method of claim 18, further comprising basing a selection of what part of the memory device is not necessary to complete a pending active-mode command on the particular active-mode command that is pending.

* * * * *